United States Patent [19]

Walczak et al.

[11] Patent Number: 4,798,975
[45] Date of Patent: Jan. 17, 1989

[54] HIGH NOISE IMMUNITY INPUT LEVEL DETECTOR WITH HYSTERESIS

[75] Inventors: Thomas J. Walczak, Fox River Grove; Michael P. Metroka, Algonquin, both of Ill.

[73] Assignee: Motorola, Inc., Schaumburg, Ill.

[21] Appl. No.: 85,444

[22] Filed: Aug. 13, 1987

[51] Int. Cl.⁴ .......................................... H03K 5/153
[52] U.S. Cl. ................................. 307/350; 307/362; 307/529
[58] Field of Search ............... 307/350, 358, 362, 529, 307/475

[56] References Cited

U.S. PATENT DOCUMENTS

| | | | |
|---|---|---|---|
| 3,553,486 | 1/1971 | Dow | 307/213 |
| 3,656,002 | 4/1972 | Gilson et al. | 307/350 |
| 4,438,349 | 3/1984 | Shoji | 307/362 |
| 4,455,534 | 6/1984 | Gillig | 330/51 |
| 4,581,541 | 4/1986 | Nakayama et al. | 307/350 |

FOREIGN PATENT DOCUMENTS 116272  9/1980  Japan .

OTHER PUBLICATIONS

"On/Off Sense Circuit in a Dynatac Coam Cellular Mobile Radio" sold by motorola.
Motorola Catalog No. CR720 "Remote CB Radio".

*Primary Examiner*—John Zazworsky
*Attorney, Agent, or Firm*—Melvin A. Schechtman; Robert J. Crawford

[57] ABSTRACT

A logic interface signal input with a high degree of electrical noise immunity, particularly suited for use in an automative environment for detecting an on/off control signal multiplexed with an information signal such as a voice audio signal. The invention provides a fast logic output signal in response to the level of the control signal, which is suitable for driving higher speed circuitry and which permits detection to be highly immune from electrical transients or variations in power supply voltage. The invention permits the information signal to be combined with the control signal through polarized means, such as an electrolytic capacitor.

15 Claims, 2 Drawing Sheets

HIGH NOISE IMMUNITY INPUT LEVEL DETECTOR WITH HYSTERESIS

BACKGROUND OF THE INVENTION

1. Technical Field of the Invention

This invention pertains to logic interface circuits and in particular to those for use in the automotive environment.

2. Description of the Prior Art

Electrical equipment designed to operate in the automotive environment must have a high degree of electrical noise immunity. The automotive DC power source, often designated "A+" and provided by a battery and charging system with a nominal output rating of 13.6 Vdc, varies considerably during vehicle operation and exhibits severe over- and under-voltage transients. For example, during the operation of starting the vehicle, an electrical starter motor "cranks" the gasoline engine. The heavy current drain, coupled with the internal resistance of the battery and the starting circuit wiring, causes the A+ voltage to drop by several volts and remain low for the duration of cranking Once the engine starts, disengagement of the starter load allows the A+ voltage to return rapidly to its nominal value; charging may then raise the voltage to an upper limit, typically 16.3 Vdc. During abnormal conditions, such as when accessory loads suddenly become disconnected, the A+ voltage may show overvoltage transients. Automotive electrical equipment must typically withstand at least 32 Vdc.

The voltage transients of the A+ supply can cause false triggering or erroneous operation of logic circuits used, for example, to sense the states of transducer outputs. Furthermore, many transistorized circuits and, in particular, commercially available monolithic integrated logic circuit families, often cannot withstand the high overvoltage transients.

Another challenge in the automotive environment has been to economize in electrical equipment cabling and interconnection requirements. Increased complexity and control requirements make it necessary to provide more interconnections between user-interface devices and remotely located electrical systems being controlled. An example of this is a mobile two-way radio installation, which may include both an operator interface in the form of a control unit containing operator controls and a remotely located, vehicle-mounted transceiver unit containing the bulk of the radio circuitry. To reduce cabling density, modern systems often multiplex signals on the interconnection wires.

For many situations, of which control of mobile radios or radiotelephones in automotive environments is merely an example, the prior art has not produced logic interface circuits to meet the difficult requirements of operating over a wide range of supply voltages, withstanding severe transient voltages without failure or erroneous operation, and providing for multiplexing techniques to reduce cost, weight, and space of interconnections.

SUMMARY OF THE INVENTION

This invention provides a logic interface signal input with a high degree of electrical noise immunity, which allows it to be used in an automotive environment. The invention applies to a system having a control signal that assumes one of two states, such as an "on/off" control, and an information signal that makes instantaneous variations about a quiescent level, such as a voice audio signal from a line-driver amplifier, and it provides a method for detecting the state of the control signal while permitting the information signal to be multiplexed with the control signal. The invention provides a fast logic signal suitable for driving higher speed circuitry, such as a control microprocessor, and permits detection to be highly immune from electrical transients or variations in power supply voltage.

A preferred embodiment of the present invention involves combining the control signal with the information signal such that the information signal varies about the quiescent level assumed by the control signal; producing a threshold detection signal indicating the level of the control signal relative to a threshold equal to approximately half-supply; and producing a logic output signal that makes fast, regenerative transitions substantially independent of the transition rate of the threshold detection signal. The invention provides for maintaining the polarity between the quiescent level of the multiplexed information signal and that of the information signal, which allows the information signal to be combined with the control signal through polarized means such as an electrolytic capacitor.

BRIEF DESCRIPTION OF THE DRAWINGS

The invention is best understood in connection with the accompanying Drawings, in which.

DETAILED DESCRIPTION OF THE PREFERRED EMBODIMENT

A mobile radio used in an automotive environment, of which a cellular radiotelephone is a convenient example, provides an appropriate setting for describing the preferred embodiment of the invention. A cellular radiotelephone mobile subscriber unit has two major parts: a control unit and a transceiver unit. The transceiver portion houses the circuits for receiving and transmitting the radio signals and may be mounted in the vehicle remote from the user. The control unit provides the user interface to the transceiver and is typically mounted within the passenger compartment of the vehicle. A control cable couples the units together. The complexity of the control functions may require many control and audio signals to pass between the units; multiplexing of signals within the control cable reduces the burdens of dense cabling. Installations that use multiple control units create particular problems, which the invention also addresses.

Figure 1:
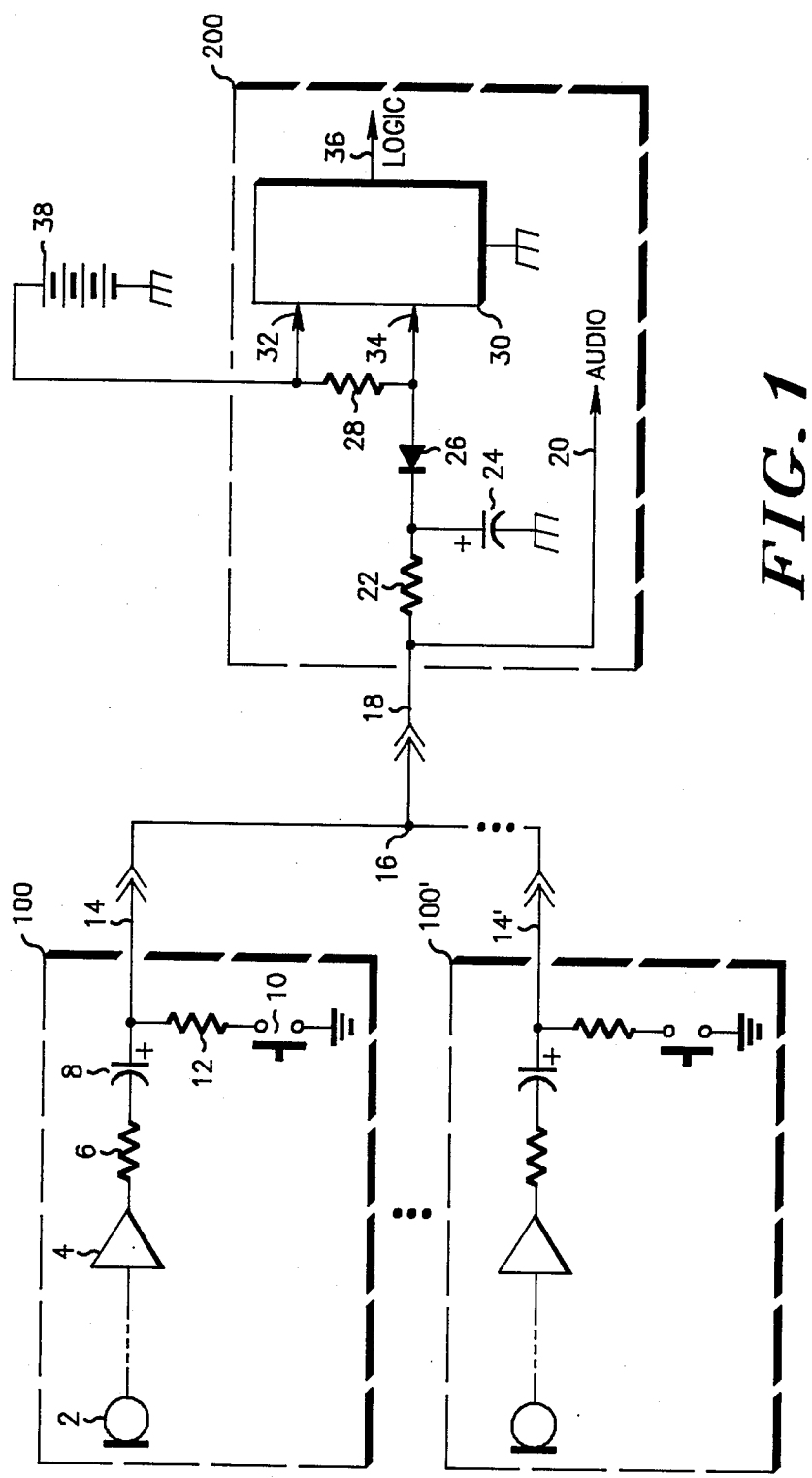
FIG. 1 shows the application of the invention to provide a logic signal input with a high degree of electrical noise immunity for use with a mobile radio transceiver in an automotive environment.

FIG. 1 shows a typical vehicular radiotelephone installation. Box 100 represents the control unit; box 200 represents the transceiver unit. A microphone 2 transduces voice input and produces electrical output that couples through an audio amplification and signal processing chain to a line driver amplifier 4. The line driver, operated at a typical quiescent point of 5 Vdc, couples an amplified audio signal through resistor 6 and blocking capacitor 8 onto the interconnection cable at 14. The control unit includes a push button 10, which can ground resistor 12. To activate logic circuitry in the transceiver, for example to turn the transceiver on or off, the user momentarily pushes the button. A logic interface circuit 30 in the transceiver detects the momentary contact closure and provides a fast logic output signal (36) in response. Connections to the interface circuit permit audio to be multiplexed with the contact closure signal on the control cable and to be picked-off at point 20. FIG. 1 shows only the pertinent portions of the transceiver, including connections to the DC power source, designated as "A+," (38), and miscellaneous coupling components, (22, 24, 26, and 28). It shows further that more than one control unit may be coupled to the transceiver at the same time, as indicated by control unit 100', output line 14', and the dotted connection to cable 16.

The quiescent state of the interface circuit is "off." Resistor 28 (100 kilohms nominal) holds input pin 34 at the A+ potential, which is well above the logic threshold of approximately half-supply. Closing the push-button pulls resistor 12 (4700 Ohms) to ground, which causes input 34 to fall below the logic threshold as capacitor 24 discharges. However, as the input goes below threshold, the interface circuit sources current, from input 34, which flows through resistor 12 and develops sufficient voltage to maintain a positive bias across capacitor 8 relative to the output voltage of the line driver amplifier 4.

Figure 2:
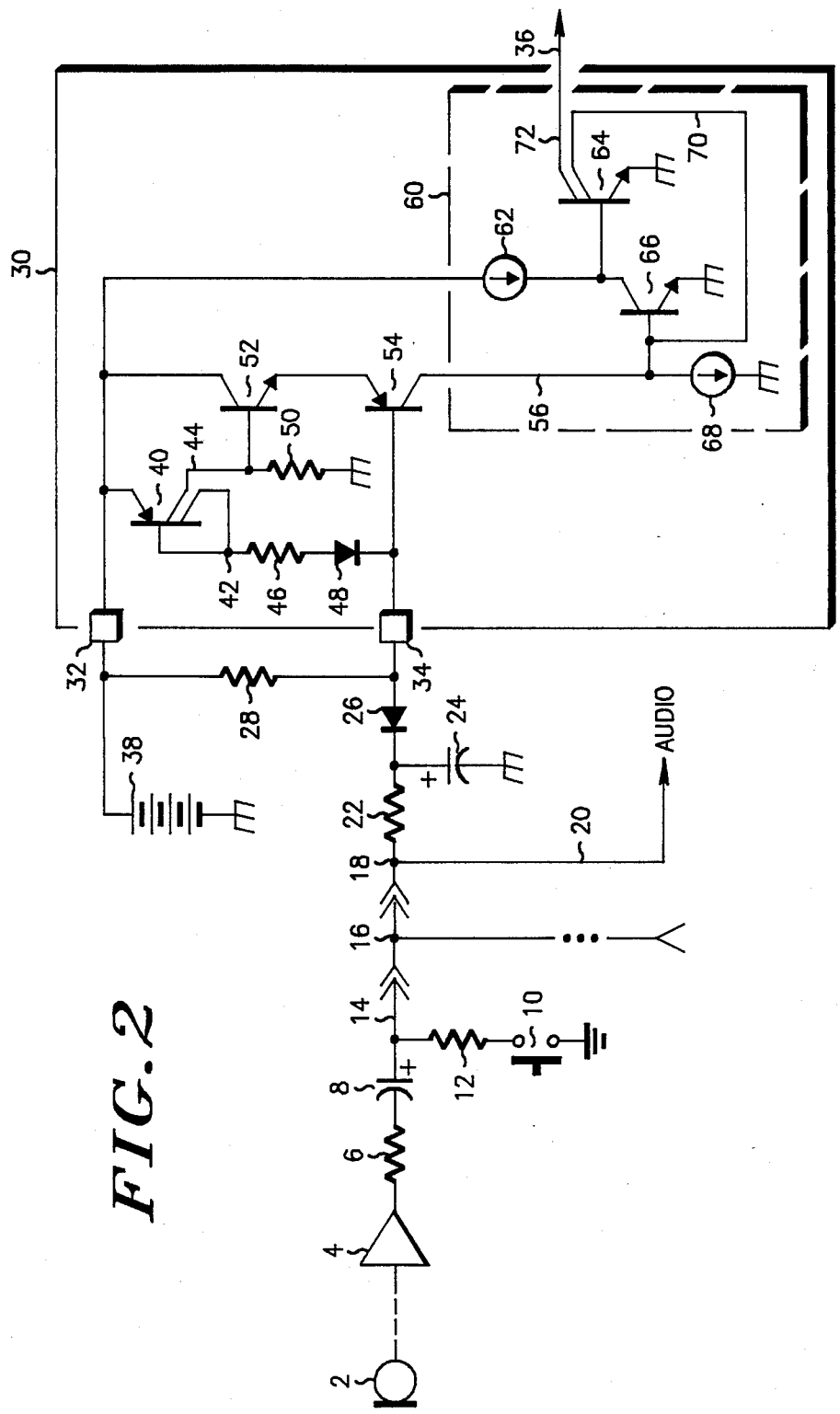
FIG. 2 shows greater detail of the logic signal input.

FIG. 2 shows details of the logic interface circuit. The interface circuit has two major parts a threshold circuit, which senses the input voltage at pin 34 and produces an output current at collector terminal 56; and a signal conditioner (60), which speeds up the current transitions generated by the threshold circuit and produces a fast logic output signal at 36. The incremental input impedance of the threshold circuit has a nonlinear characteristic: for inputs above threshold, it is very high, so the circuit has very little loading effect; as the input signal falls below threshold, the impedance switches to a very low value that loads the external circuit and prevents the input from being able to fall substantially below threshold. The threshold circuit itself comprises current mirror 40, devices 48, 52, and 54, resistor 46 (50 kilohms nominal), and resistor 50 (100 kilohms nominal). As input 34 goes below the A+ voltage applied to power pin 32, the current mirror control branch 42 turns on and produces an incremental input impedance equal to the nominal 50 kilohms of resistor 46 in series with diode 48 and the emitter-base diode of mirror branch 42. Mirror current through branch 44 into resistor 50 pulls the base of device 52 upwards. The circuit reaches threshold when the base of device 52 has risen above the voltage at input 34 by approximately two base-emitter diode drops, at which point, devices 52 and 54 turn on, and collector 56 develops output current. As the input goes below threshold, the incremental input impedance of the threshold circuit becomes very low, and it supplies current to the external circuit through the low impedance path of common-collector device 52 in series with the emitter-base junction of device 54. The ratio between resistor 50 and resistor 46 and the configuration of diode 48 and base-emitter junctions in devices 52 and 54 sets the logic threshold slightly above half-supply This threshold remains at approximately half-supply to provide maximum noise immunity regardless of supply variations. Responding to the level of an input signal, rather than to its transitions, provides additional immunity against noise transients and also permits an audio signal of restricted amplitude to be superimposed on the input without triggering the interface circuit.

Device 52 can supply current to the external circuit through the base-emitter junction of device 54 as necessary to prevent reverse biasing of the control unit blocking capacitor. Inherent collector current limiting at about 6 mA in the PNP devices used for this embodiment prevented currents from exceeding safe values.

To provide a stable and predictable input threshold, the circuit relies on matching of the respective resistors and semiconductor devices, which a monolithic realization conveniently provides. Under such conditions, the input threshold remains at approximately half-supply over a wide range of supply voltages. In particular, the circuit will operate from at least 6 Vdc to 16.3 Vdc. This voltage range allows the circuit to be used in portable transceiver applications, which rely on battery voltages that can reach as low as 6 volts at "end-of-life," as well as in vehicular applications, for which high-limit A+ voltage is typically specified as 16.3 Volts DC.

The signal conditioner circuit (60) for this embodiment is an integrated-injection logic ($I^2L$) design, comprising injector 62, dual output device 64, input device 66, and current sink 68. Feedback through collector 70 provides hysteresis. To turn on the circuit, current from collector 56 must exceed the combination of sink current 68 and the current drawn by collector 70. Once device 66 turns on, it diverts injector current 62 and cuts off collector 70, so the circuit remains on until input current at 56 falls below the level of sink current 68 alone. Hysteresis provides immunity from minor noise fluctuations in the trigger current, causes fast regenerative transitions between states, and makes the rate of output transitions substantially independent of the rate of input transitions.

The components external to circuit block 30 provide additional immunity from the inherent electrical noise of the automotive environment, such as transient loading from engine cranking During engine cranking, the A+ voltage may drop by several volts, but diode 26 prevents capacitor 24 from discharging. The voltages on pins 32 and 34 both decrease; when cranking terminates and the A+ voltage suddenly rises to its normal value, both pins follow the increase in voltage. Diode 26, which isolates capacitor 24, allows the capacitor to remain at the quiescent A+ voltage for a considerably longer time than the expected duration of cranking. When the voltage returns to normal, capacitor 24 will not have discharged and, therefore, will not hold pin 34 at a lower voltage. Otherwise, the reduced voltage on pin 32 might be sufficiently low to cause the voltage on pin 34 to be below the threshold voltage of the logic interface circuit and would cause a logic output signal to change state.

The circuit will also tolerate certain expected overvoltage transients without false triggering or device breakdown. First, if the A+ voltage suddenly increases but stays within approximately twice normal value, the half-supply input threshold remains below the voltage at pin 34, so the circuit will not trigger. Second, the circuit configuration allows the various bipolar devices to withstand high voltage transients. In the semiconductor fabrication process used for the preferred embodiment, NPN devices typically exhibit breakdown $BV_{ceo}$ of less than 22 Volts, whereas $BV_{cbo}$ exceeds 65 Volts. In the quiescent state, push-button 10 is open, which allows resistor 28 to apply A+ voltage to pin 34 and keep current mirror 40 off. Without mirror current flowing, resistor 50 holds the base of device 52 at ground potential. Meanwhile, the base of device 54 is at A+ potential, so the emitter-base junctions of both devices are reverse biased. Upon sudden A+ increases, the voltage on pin 32 increases, but that on pin 34 does not, being held by capacitor 24. This increased voltage appears across the collector/emitter of NPN device 52 through the reverse biased emitter-base diode of device 54. The path through resistor 50 allows device 52 to withstand this voltage in the $BV_{cbo}$ mode and support large transient overvoltage. The other devices subject to A+ transients are PNP devices, which, for this process, have greater $BV_{ceo}$ breakdown voltage than do the NPN devices. The process specifications illustrated here are merely exemplary; it will be understood that the invention relates to a circuit configuration that operates devices in a high breakdown voltage mode.

The circuit constructed according to this invention draws very little current in the standby mode. When the push-button is open, the interface circuit draws no current through current mirror 40; the signal conditioner draws only the small injector current for the I²L. The injector current affects the speed of the circuit, but, for a relatively slow signal such as a manual push-button contact, injector current on the order of 1 microampere suffices. During contact closure, the circuit draws additional current momentarily as necessary to prevent reverse biasing of the coupling capacitors.

Another aspect of the invention is to allow audio information to appear on the control unit line, which is normally biased to A+. This requires that the logic interface circuit neither false trigger nor breakdown in the presence of an AC signal on the trigger line and that it not clip the audio signal at its input. The logic threshold of approximately half-supply allows audio signals on the input to swing below the quiescent voltage A+ without triggering the circuit or allowing the current mirror to conduct current and affect the audio signals. As the audio drives the voltage across capacitor 24 above the A+ voltage, diodes 26 and 48 and device 54 reverse bias and prevent clipping of the audio. For this embodiment, the base-emitter breakdown voltages were approximately 6V for NPN devices and 84V for PNP devices, sufficient for the levels of audio signals. Circuitry (not shown) in the transceiver can translate an audio signal biased at A+ to a quiescent voltage suitable for audio processing in the transceiver.

The impedance of resistor 22 in series with capacitor 24 is sufficiently low relative to the source impedance of a control unit that audio levels do not vary appreciably if an additional control unit is coupled in parallel as an additional audio source. The time constant $R_6C_8$ matches the time constant $R_{22}C_{24}$, which provides flat frequency response over the voice band of 300-3000 Hz. Typical components values are:

$R_6$ 680 ohms, $C_8$ 1.0 ufd;
$R_{22}$ 100 ohms, $C_{24}$ 6.8 ufd.

We claim:
1. In a system having an input control signal that assumes one of two states and an input information signal that makes instantaneous variations about a quiescent level, a circuit for detecting the state of the input control signal and for multiplexing the input information signal with the input control signal, comprising:
  means for providing a multiplexed input signal having a control component and an information component, the control component assuming one of two levels according to the state of the input control signal and the information component varying, according to the instantaneous variations of the input information signal, about the level assumed by the control component;
  threshold means for providing a threshold level which is set relative to a power supply level such that the threshold level tracks the power supply level;
  comparison means for comparing the level assumed by the control component to the threshold level, including bipolar transistor means for providing a current signal indicative of the level assumed by the control signal, said comparison means having means for deterring junction breakdown in said bipolar transistor means;
  standby power means for substantially reducing the operating power of said comparison means and said threshold means when the level assumed by the control component is approximately equal to said power supply level;
  means, responsive to said current signal, for producing a logic output signal to indicate the status of the control component; and
  means for maintaining a constant polarity, independent of the state of the input control signal, between the level of the control component and the quiescent level of the input information signal.

2. A circuit, according to claim 1, wherein the means for maintaining a constant polarity includes means for loading the multiplexed input signal by an incremental input impedance having a nonlinear characteristic such that:
  when the level of the control component is greater than the threshold level, the incremental input impedance has a substantially reduced loading effect on the multiplexed input signal, and,
  when the level of the control component is less than the threshold level, the incremental input impedance loads the multiplexed input signal and prevents the level of the control component from being able to fall substantially below the threshold level.

3. A circuit, according to claim 1, wherein the means for producing a logic output signal includes means for enabling the logic output signal to transmit between two states at a rate that is substantially independent of the rate of control component transitions.

4. A circuit, according to claim 1, wherein the threshold means includes means for setting the threshold level equal to approximately one-half of the level of the power supply level.

5. In a system having an input control signal that assumes one of two states and an input information signal that makes instantaneous variations about a quiescent level, a circuit for detecting the state of the input control signal and for multiplexing the input information signal with the input control signal, comprising:
  means for providing a multiplexed input signal having a control component and an information component, the control component assuming one of two levels according to the state of the input control signal and the information component varying, according to the instantaneous variations of the input information signal, about the level assumed by the control component;
  threshold means for providing a threshold level which is set relative to a power supply level such that the threshold level tracks the power supply level;
   comparison means for comparing the level assumed by the control components to the threshold level; and
   means, responsive to said comparison means, for producing a logic output signal to indicate the status of the control component.

6. A circuit, according to claim 5, wherein the comparison means includes bipolar transistor means for providing a current signal indicative of the level assumed by the control signal, and means for deterring junction breakdown in said bipolar transistor means.

7. A circuit, according to claim 6, further including standby power means for substantially reducing the operating power of said comparison means and said threshold means when the level assumed by the control component is approximately equal to said power supply level.

8. A circuit, according to claim 5, further including standby power means for substantially reducing the operating power of said comparison means and said threshold means when the level assumed by the control component is approximately equal to said power supply level.

9. In a system having an input control signal that assumes one of two states and an input information signal that makes instantaneous variations about a quiescent level, a circuit for detecting the state of the input control signal and for multiplexing the input information signal with the input control signal, comprising:
   means for providing a multiplexed input signal having a control component and an information component, the control component assuming one of two levels according to the state of the input control signal and the information component varying, according to the instantaneous variations of the input information signal, about the level assumed by the control component;
   threshold means for providing a threshold level;
   comparison means for comparing a the level assumed by the control component to the threshold level;
   standby power means for substantially reducing the operating power of said comparison means and said threshold means when the level assumed by the control component is approximately equal to said power supply level; and
   means, responsive to said means for comparing, for producing a logic output signal to indicate the status of the control component.

10. A circuit, according to claim 9, wherein the comparison means includes bipolar transistor means for providing a current signal indicative of the level assumed by the control signal, and means for deterring junction breakdown in said bipolar transistor means.

11. In a system having an input control signal that assumes one of two states and an input information signal that makes instantaneous variations about a quiescent level, a circuit for detecting the state of the input control signal and for multiplexing the input information signal with the input control signal, comprising:
   means for providing a multiplexing input signal having a control component and an information component, the control component assuming one of two levels according to the state of the input control signal and the information component varying, according to the instantaneous variations of the input information signal, about the level assumed by the control component;
   threshold means for providing a threshold level;
   comparison means for comparing the level assumed by the control component to the threshold level, and including bipolar transistor means for providing a current signal indicative of the level assumed by the control signal, and including means for deterring junction breakdown in said bipolar transistor means; and
   means, responsive to said current signal, for producing a logic output signal to indicate the status of the control component.

12. In a system having an input control signal that assumes one or two states and an input information signal that makes instantaneous variations about a quiescent level, a method for detecting the state of the input control signal and for multiplexing the input information signal with the input control signal, comprising the steps of:
   providing a multiplexed input signal having a control component and a information component, the control component assuming one of two levels according to the state of the input control signal and the information component varying, according to the instantaneous variations of the input information signal, about the level assumed by the control component;
   providing a threshold level which is set relative to a power supply level such that the threshold level tracks the power supply level;
   comparing the control component to the threshold level; and
   responsive to said step of comparing, producing a logic output signal to indicate the status of the control component.

13. The method, according to claim 12, wherein the step of maintaining a constant polarity includes the step of loading the multiplexed input signal by an incremental input impedance having a nonlinear characteristic such that:
   when the level of the multiplexed control component is greater than the detection threshold, the incremental input impedance having a substantially reduced loading effect on the multiplexed input signal, and,
   when the level of the multiplexed control component is less than the detection threshold, the incremental input impedance loads the multiplexed input signal and prevents the level of the multiplexed control component from being able to fall substantially below the detection threshold.

14. The method, according to claim 12, wherein the step of producing a logic output signal includes producing hysteresis to provide immunity from minor noise fluctuations in the threshold detection signal.

15. The method, according to claim 12, wherein the step of providing a threshold level includes setting the threshold level equal to approximately one-half of the level of the power supply level.

* * * * *